United States Patent
Minakata et al.

(10) Patent No.: US 11,492,299 B2
(45) Date of Patent: Nov. 8, 2022

(54) NITRIDE CERAMIC RESIN COMPOSITE BODY

(71) Applicant: DENKA COMPANY LIMITED, Tokyo (JP)

(72) Inventors: Yoshitaka Minakata, Omuta (JP); Eri Sasaki, Machida (JP); Toshitaka Yamagata, Omuta (JP); Saori Inoue, Omuta (JP); Ryo Yoshimatu, Omuta (JP); Ryuji Koga, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 402 days.

(21) Appl. No.: 16/766,954

(22) PCT Filed: Dec. 5, 2018

(86) PCT No.: PCT/JP2018/044805
§ 371 (c)(1),
(2) Date: May 26, 2020

(87) PCT Pub. No.: WO2019/111978
PCT Pub. Date: Jun. 13, 2019

(65) Prior Publication Data
US 2021/0032171 A1 Feb. 4, 2021

(30) Foreign Application Priority Data
Dec. 5, 2017 (JP) .............................. JP2017-233682

(51) Int. Cl.
| | | |
|---|---|---|
| H05K 1/02 | (2006.01) | |
| H05K 1/03 | (2006.01) | |
| H05K 1/09 | (2006.01) | |
| C04B 35/583 | (2006.01) | |
| C04B 35/584 | (2006.01) | |
| C04B 35/634 | (2006.01) | |
| C04B 41/82 | (2006.01) | |
| C04B 41/48 | (2006.01) | |
| C04B 38/00 | (2006.01) | |
| C08G 59/24 | (2006.01) | |
| C09J 163/00 | (2006.01) | |
| H05K 3/38 | (2006.01) | |

(52) U.S. Cl.
CPC ...... *C04B 41/4853* (2013.01); *C04B 38/0051* (2013.01); *C04B 41/82* (2013.01); *C08G 59/24* (2013.01); *C09J 163/00* (2013.01); *H05K 1/0313* (2013.01); *H05K 3/386* (2013.01); C04B 2235/386 (2013.01); H05K 2201/10106 (2013.01)

(58) Field of Classification Search
CPC .. H05K 1/02; H05K 1/03; H05K 1/09; H05K 1/0203; H05K 1/0271; H05K 1/0306; H05K 1/0313; H05K 1/0346; H05K 1/0373; H05K 3/022; H05K 3/386; H05K 2201/066; H05K 2201/0104; H05K 2201/10106; C04B 35/583; C04B 35/584; C04B 35/634; C04B 41/009; C04B 41/82; C04B 41/4853
USPC .......................................................... 523/445
See application file for complete search history.

(56) References Cited

U.S. PATENT DOCUMENTS

| | | | |
|---|---|---|---|
| 2013/0157061 A1 | 6/2013 | Sogame et al. | |
| 2013/0299962 A1 | 11/2013 | Ide et al. | |
| 2016/0227644 A1* | 8/2016 | Hirotsuru | H05K 1/0353 |
| 2019/0092695 A1* | 3/2019 | Nishi | B32B 5/16 |

FOREIGN PATENT DOCUMENTS

| | | |
|---|---|---|
| JP | S62-126694 A | 6/1987 |
| JP | 2006-63315 A | 3/2006 |
| JP | 2009-49062 A | 3/2009 |
| JP | 2011-184507 A | 9/2011 |
| JP | 2013-239486 A | 11/2013 |
| JP | 2014-189701 A | 10/2014 |
| JP | 2014-196403 A | 10/2014 |
| JP | 2016-103611 A | 6/2016 |
| WO | 2011/152402 A1 | 12/2011 |
| WO | 2017/155110 A1 | 9/2017 |

OTHER PUBLICATIONS

Feb. 12, 2019 International Search Report issued in International Patent Application No. PCT/JP2018/044805.

* cited by examiner

*Primary Examiner* — Xiaoliang Chen
(74) *Attorney, Agent, or Firm* — Oliff PLC

(57) ABSTRACT

A nitride-based ceramics resin composite body having thermal conductivity, electrical insulation, and adhesion to adherends equal to conventional products, and having improved heat resistance reliability during the reflow process, and a thermal conductive insulating adhesive sheet using the same are provided. A nitride-based ceramics resin composite body in which a thermosetting resin composition is impregnated in a porous nitride-based ceramics sintered body is provided. The thermosetting resin composition includes a specific epoxy resin and a bismaleimide triazine resin, and a water absorption of the thermosetting resin composition in a completely cured state measured in accordance with method A in JIS K7209 (2000) is 1% by mass or less.

9 Claims, No Drawings

NITRIDE CERAMIC RESIN COMPOSITE BODY

FIELD OF THE INVENTION

The present invention relates to a nitride-based ceramics resin composite body in which a thermosetting resin composition is impregnated into a nitride-based ceramics sintered body, and relates to a thermal conductive insulating adhesive sheet using the nitride-based ceramics resin composite body, and relates to a metal circuit board comprising the thermal conductive insulating adhesive sheet, further relates to a power module structure and a LED light emitting device including the metal circuit board.

BACKGROUND OF THE INVENTION

In recent years, with the advancement of high performance and miniaturization of electronic devices represented by mobile phones, LED lighting devices, power modules for vehicles and the like, mounting technologies on each level such as semiconductor devices, printed wiring board mounting and device mounting, have been rapidly advanced. For this reason, the heat generation density generated by an electronic circuit in an electronic device is increasing year by year, and how to efficiently release the heat generated during use, and reliability of the electronic device are important issues. Therefore, a thermal conductive insulating adhesive sheet used for fixing an electronic member and also transmitting heat to a cooler is required to have high thermal conductivity and heat resistance reliability.

As the above-mentioned thermal conductive insulating adhesive sheet, a thermal conductive insulating adhesive sheet has been conventionally used, which is obtained by dispersing a ceramics powder with a high thermal conductivity such as aluminum oxide, silicon nitride, boron nitride, and aluminum nitride in a thermosetting resin in which a curing reaction of the thermosetting resin has almost not progressed to form a thermosetting resin composition, and then forming this into a sheet by coating with a coater or the like, and then heating to obtain an incomplete curing state in which the curing reaction of the thermosetting resin is not completed. The degree of curing (progression state) of the thermosetting resin can be indicated by, for example, the curing rate of the thermosetting resin. However, the state of "incomplete curing" described above and in the present invention is a word that means a state such that the curing reaction itself is incomplete while the fluidity of the thermosetting resin is reduced and its shape is substantially maintained, and the curing reaction can proceed further. The state is sometimes referred to as a "B stage". That is, in the present invention, the degree of curing of the thermosetting resin composition is not necessarily strictly defined, but the degree of curing itself can be determined by the above-described curing rate.

The aforementioned conventional thermal conductive insulating adhesive sheet is adhered to an adherend such as an electronic member, an electronic circuit board, and a cooler, and then is heated to soften and melt the thermosetting resin in an incompletely cured state and to develop the adhesiveness by penetrating into the irregularities on the surface of the adherend. Then, by further advancing the heating to bring the thermosetting resin into a completely cured state, adhesion between the thermal conductive insulating adhesive sheet and the adherend is strengthened.

If the above-mentioned conventional thermal conductive insulating adhesive sheet is used, there is no need to separately form an adhesive layer (for example, a layer in which ceramics powder is dispersed in an uncured or incompletely cured thermosetting resin) on the side of the adherend such as an electronic member, and it is not necessary to apply the adhesive layer or introduce a precise coating device. Since it is easy for a user to operate, it is generally widely used.

Patent Literature 1 discloses a method for manufacturing a board for metal circuit, comprising a step of disposing on a metal substrate an adhesive sheet in B-stage produced from a composition for forming an adhesive sheet, containing an inorganic filler, an epoxy resin and a curing agent for the epoxy resin; a step of further disposing a metal foil on the adhesive sheet disposed on the metal substrate; and a step of forming a board for a metal circuit by integrating the laminate of the metal substrate, the adhesive sheet, and the metal foil by heating under pressure until the adhesive sheet is rendered in a C-stage state. In other words, an application example of a conventional thermal conductive insulating adhesive sheet is disclosed in the Patent Literature 1.

On the other hand, there are methods of increasing the thermal conductivity of a conventional thermal conductive adhesive sheet: (1) to increase the thermal conductivity of the thermosetting resin in a completely cured state; (2) to increase the thermal conductivity of the ceramics powder itself; (3) to increase the particle diameter of the ceramics powder within a practical range; and (4) to densely fill the ceramics powder. In Patent Literature 2, it is possible to obtain a thermal conductive insulating adhesive sheet having a high thermal conductivity by the method (1). Further, In Patent Literature 3, it is possible to use boron nitride having a high thermal conductivity as a ceramics powder, that is, to obtain a thermal conductive insulating adhesive sheet having a high thermal conductivity by the method (2). Further, in Patent Literature 4, it is possible to obtain a thermal conductive insulating adhesive sheet having high a thermal conductivity by the methods (2) and (4). Further, in Patent Literature 5, the methods of (2), (3), and (4), which include combining aluminum nitride powders having various particle diameters in a specific percentage, make it possible to obtain a thermal conductive insulating adhesive sheet having a high thermal conductivity.

CITATION LIST

Patent Literature

[Patent Literature 1] Japanese Patent Application Publication No. 2009-49062
[Patent Literature 2] Japanese Patent Application Publication No. 2006-63315
[Patent Literature 3] Japanese Patent Application Publication No. 2014-196403
[Patent Literature 4] Japanese Patent Application Publication No. 2011-184507
[Patent Literature 5] Japanese Patent Application Publication No. 2014-189701
[Patent Literature 6] Japanese Patent Application Publication No. S62-126694
[Patent Literature 7] Japanese Patent Application Publication No. 2016-103611

SUMMARY OF THE INVENTION

However, in the inventions disclosed in Patent Literature 1 and Patent Literatures 3 to 5 described above, since a thermosetting resin layer having a low thermal conductivity exists between the particles of the ceramics powder, the thermal conductivity does not exceed the maximum of 16 W/(m·K) (for example, see Patent Literature 5, Table 2, Synthesis Example 7), which means there is a limit. Further, there is a limit to increasing the thermal conductivity of the thermosetting resin. In the invention disclosed in Patent Literature 2, the thermal conductivity is at most 10.5 W/(m·K) (see Table 1, Example 6). Therefore, there has been a problem in terms of heat dissipation in the demand for thermal design of electronic devices, which has become increasingly difficult to achieve in recent years.

Patent Literature 6, instead of dispersing particulate ceramics, proposes a ceramics resin composite body processed into a plate shape, in which primary ceramics particles having a high thermal conductivity are sintered to form a ceramics sintered body having a three-dimensionally continuous integrated structure, and thermosetting resin is filled in pores of the sintered body, and cured. In the invention, since the ceramics have a three-dimensionally continuous structure, a ceramics resin composite body having a high thermal conductivity can be obtained.

However, in Patent Literature 6, regarding thermosetting resin contained in a plate-shaped ceramics resin composite body, there is no description of a technical idea of imparting an adhesive function to the ceramics resin composite body by controlling the cured state to an incompletely cured state. For this reason, when this ceramics resin composite body is used, it is necessary to separately provide an adhesive layer between the adherend and the ceramics resin composite body, and there has been a problem in heat dissipation and workability.

Patent Literature 7 proposes a metal circuit board including a ceramics resin composite body in which the thermosetting resin composition contained in the ceramics resin composite body is in an incompletely cured state and is given adhesiveness. When a metal circuit board is actually used, it goes through a reflow soldering process (hereinafter referred to as a reflow process) for mounting a semiconductor chip or the like on the metal circuit board. Therefore, it is necessary to have heat resistance reliability such that separation between the metal plate that constitutes the metal circuit board and the insulating layer that is the ceramics resin composite body does not occur due to heating. However, Patent Literature 7 does not describe a ceramics resin composite body that mentions the heat resistance reliability of a metal circuit board.

In the reflow process, the cause of separation between the ceramics resin composite body and the adherend such as an electronic circuit board is considered to be as follows: moisture contained in the thermosetting resin composition contained in the ceramics resin composite body evaporates during the reflow process, and the water vapor presses the metal board to cause separation. As a countermeasure to separation of metal board, a method to reduce the amount of water contained in the thermosetting resin composition is considered. Solely for that purpose, for example, a thermosetting resin composition having a low water absorption rate may be selected. However, other than that, from a comprehensive point of view, technique capable of obtaining ceramics resin composite body having a balanced properties of ease of impregnation into ceramics sintered body and controllability of curing reaction, and satisfying thermal conductivity, adhesion to the adherend and heat resistance reliability during reflow process, and being excellent for practical use, has not been seen.

The present invention has been made in view of the above background art. One object of the present invention is to provide a nitride-based ceramics resin composite body that has thermal conductivity, electrical insulation, and adhesion to adherends equal to or better than conventional products, and also satisfies heat resistance reliability during the reflow process, and to provide a thermal conductive insulating adhesive sheet using the nitride-based ceramics resin composite body, and to provide a metal circuit board using the thermal conductive insulating adhesive sheet.

The present invention, which is intended for solving the problem, is exemplified by the following (1) to (9).

(1) The present invention is, in one embodiment, a nitride-based ceramics resin composite body in which a thermosetting resin composition is impregnated in an incompletely cured state in a porous nitride-based ceramics sintered body having three-dimensionally continuous pores, the sintered body being formed of primary particles of a nitride-based ceramics that is one or a combination of two or more selected from a group consisting of boron nitride, aluminum nitride, and silicon nitride, wherein the thermosetting resin composition comprises an epoxy resin in a ratio of 0.2 chemical equivalents or more and 1.5 chemical equivalents or less in total with respect to 1.0 chemical equivalent of a bismaleimide triazine resin, the epoxy resin being one or a combination of two or more selected from a group consisting of bifunctional naphthalene type epoxy resin, alicyclic epoxy resin, dicyclopentadiene type epoxy resin, and hydrogenated bisphenol A type epoxy resin, and a volume ratio of the thermosetting resin composition is 30% by volume or more and 65% by volume or less with respect to the nitride-based ceramics resin composite body, and a water absorption of the thermosetting resin composition in a completely cured state measured in accordance with method A in JIS K7209 (2000) is 1% by mass or less.

(2) It is preferable that in the nitride-based ceramics resin composite body according to the aforementioned (1), the porous nitride-based ceramics sintered body be a sintered body of primary particles of boron nitride.

(3) It is preferable that, in the nitride-based ceramics resin composite body according to the aforementioned (1) or (2), the thermosetting resin composition be impregnated in an incompletely cured state having a curing rate of 5% to 80%.

(4) It is preferable that, in the nitride-based ceramics resin composite body according to any one of the aforementioned (1) to (3), a glass transition temperature of the thermosetting resin composition be 180° C. or higher.

(5) It is preferable that, in the nitride-based ceramics resin composite body according to any one of the aforementioned (1) to (4), the bifunctional naphthalene type epoxy resin be 1,6-naphthalene diol diglycidyl ether, and the alicyclic epoxy resin be 3',4'-epoxycyclohexylmethyl 3,4-epoxycyclohexanecarboxylate, and the dicyclopentadiene type epoxy resin be an epoxy resin having a chemical structure represented by (Chemical Formula 1) and/or (Chemical Formula 2), and the hydrogenated bisphenol A type epoxy resin be an epoxy resin having a chemical structure represented by (Chemical Formula 3).

[Chemical Formula 1]

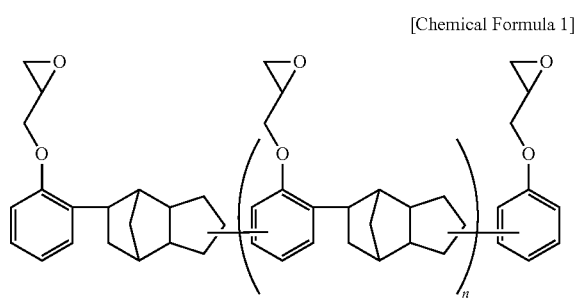

(In the formula, n is 0 or an integer of 1 or more.)

[Chemical Formula 2]

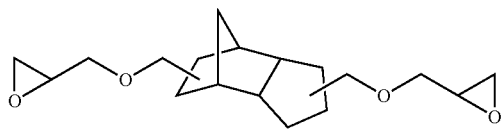

[Chemical Formula 3]

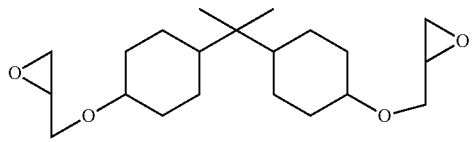

(6) The present invention, in another embodiment, is a thermal conductive insulating adhesive sheet comprising the nitride-based ceramics resin composite body according to any one of the aforementioned (1) to (5).

(7) The present invention, in a further embodiment, is a single-layer or multilayer metal circuit board, comprising the thermal conductive insulating adhesive sheet according to the aforementioned (6) as an electrical insulating layer.

(8) The present invention, in a further embodiment, is a power module structure comprising the metal circuit board according to the aforementioned (7).

(9) The present invention, in a further embodiment, is an LED light emitter comprising the metal circuit board according to the aforementioned (7).

According to one embodiment of the present invention, it is possible to provide a nitride-based ceramics resin composite body that has thermal conductivity, electrical insulation, and adhesion to adherends equal to or better than conventional products, and also satisfies heat resistance reliability during the reflow process. Especially, the nitride-based ceramics resin composite body can be used as a material for a thermal conductive insulating adhesive sheet that is capable of effectively dissipating heat generated by an electronic device. Further, according to another embodiment of the present invention, it is possible to provide a thermal conductive insulating adhesive sheet using the aforementioned nitride-based ceramics resin composite body, and to provide a metal circuit board using the aforementioned thermal conductive insulating adhesive sheet.

DETAILED DESCRIPTION OF THE INVENTION

Hereinafter, the details and manufacturing method related to <Nitride-based Ceramics resin composite Body>, <Thermal Conductive Insulating Adhesive Sheet><Metal Circuit Board>, <Power Module Structure>, and <LED Light Emitter>, which are embodiments of the present invention, will be described below, respectively.

<Nitride-Based Ceramics Resin Composite Body>

According to one embodiment, a nitride-based ceramics resin composite body of the present invention is, a nitride-based ceramics resin composite body in which a thermosetting resin composition is impregnated in an incompletely cured state in a porous nitride-based ceramics sintered body having three-dimensionally continuous pores, the sintered body being formed of primary particles of a nitride-based ceramics that is one or a combination of two or more selected from the group consisting of boron nitride, aluminum nitride, and silicon nitride. Further, in one embodiment, the thermosetting resin composition comprises a bismaleimide triazine resin and an epoxy resin in a specified chemical equivalent range, the epoxy resin being one or a combination of two or more selected from the group consisting of bifunctional naphthalene type epoxy resin, alicyclic epoxy resin, dicyclopentadiene type epoxy resin, and hydrogenated bisphenol A type epoxy resin, and an upper limit of a water absorption of the thermosetting resin composition is specified.

According to one embodiment, the porous nitride-based ceramics sintered body used in the nitride-based ceramics resin composite body of the present invention is, a sintered body made by sintering primary particles of a nitride-based ceramics that is one or a combination of two or more selected from the group consisting of boron nitride, aluminum nitride, and silicon nitride, the sintered body being sintered so that the pores formed after sintering have an integrated structure in which the pores are three-dimensionally continuous while maintaining porosity.

(Porous Nitride-Based Ceramics Sintered Body)

Considering application to power modules and the like that require high thermal conductivity, the above-described porous nitride-based ceramics sintered body is made by sintering primary particles of a nitride-based ceramics that is one or a combination of two or more selected from the group consisting of boron nitride, aluminum nitride, and silicon nitride having a thermal conductivity of at least 40 W/(m·K) or more, the sintered body being sintered so that the pores formed after sintering have an integrated structure in which the pores are three-dimensionally continuous while maintaining porosity. The thermal conductivity of the nitride-based ceramics is a value at 25° C. and is determined by using a laser flash method in accordance with JIS R1611 (1997). Commercially available products can be used as the primary particles of the nitride-based ceramics of boron nitride, aluminum nitride, and silicon nitride. In addition, it is preferable to use boron nitride as the nitride-based ceramics, and it is preferable to use boron nitride in either an amorphous or hexagonal form.

(Method for Manufacturing Nitride-Based Ceramics Sintered Body)

The method for manufacturing the porous nitride-based ceramics sintered body is not particularly limited, but a method in which primary particles of nitride-based ceramics and a powder of a sintering aid are mixed and sintered at a high temperature is possible. For example, it can be manufactured by blending powdery boron nitride as primary particles with powders of sintering aid such as calcium carbonate, sodium carbonate, boric acid and the like so as to be 0.01 to 20% by mass in internal percentage to form a mixed powder, and forming the mixed powder with a publicly known method such as a molding method or a cold isostatic pressing method (CIP), and then, in a non-oxidizing atmosphere such as nitrogen or argon, sintering in a temperature range of 1500 to 2200° C. for 1 to 30 hours. In addition, the sintering aid may not remain in the ceramics sintered body due to volatilization during the sintering process. Methods for manufacturing such a porous nitride-based ceramics sintered body are publicly known, and are also commercially available as a general product. Also, when powdery aluminum nitride or silicon nitride is used as the primary particles, it can be manufactured in the same manner as described above using yttria, alumina, magnesia, rare earth element oxide, and the like as a sintering aid. There is no particular limitation on the type of furnace used for sintering, but for example, a batch furnace such as a muffle furnace, a tubular furnace, and an atmosphere furnace, and a continuous furnace such as a rotary kiln, a screw conveyor furnace, a tunnel furnace, a belt furnace, a pusher furnace, and a vertical continuous furnace can be mentioned. A batch furnace is preferably used when a large number of types of nitride-based ceramics sintered bodies are manufactured little by little, and a continuous furnace is preferably used when a large number of a certain type of nitride-based ceramics sintered bodies are manufactured.

Regarding the internal structure of the porous nitride-based ceramics sintered body, whether or not it is sintered so as that the pores formed after sintering have an integrated structure that is three-dimensionally continuous while maintaining porosity, can be determined as follows: using a commercially available scanning electron microscope, the primary particles present at an arbitrary cross section of the nitride-based ceramics sintered body are observed at a magnification of about 1500 times to observe whether the primary particles are three-dimensionally continuous while having a continuous porous structure by the sintering.

In addition, in the porous structure of the nitride-based ceramics sintered body, it is desirable that all pores are three-dimensionally continuous. However, as long as the heat dissipation characteristics and other characteristics which are the subject of the present invention are not affected, the pores do not have to be strictly all continuous pores. In addition, as a pretreatment for electron microscopic observation, after embedding the nitride-based ceramics sintered body as a sample in a resin, processing it with a CP (cross-section polisher) method, fixing it to a sample stage, and then usually osmium coating the test surface, can be applied. Further, even after impregnating the porous nitride-based ceramics sintered body with a resin composition to form a nitride-based ceramics resin composite body, whether or not it is sintered so as that the pores formed after sintering have an integrated structure that is three-dimensionally continuous while maintaining porosity, can be determined by investigating whether or not the nitride-based ceramics sintered body can maintain the state before the impregnation. Specifically, a resin-free nitride-based ceramics sintered body can be obtained by ashing the resin composite at 500 to 900° C. in the air atmosphere, and if the primary particles are not combined three-dimensionally and continuously inside the nitride-based ceramics sintered body, its shape cannot be maintained during the ashing.

(Average Major Diameter of Primary Particles of Nitride-Based Ceramics)

The average major diameter of the primary particles of the nitride-based ceramics constituting the nitride-based ceramics sintered body is preferably in the range of 3.0 to 60 μm, more preferably in the range of 4.0 to 40 μm, and even more preferably in the range of 5.0 to 20 μm. When the average major diameter is 3.0 μm or more, the modulus of elasticity of the nitride-based ceramics sintered body tends to be low. A thermal conductive insulating adhesive sheet according to one embodiment of the present invention, which is obtained by appropriately forming a nitride-based ceramics resin composite body comprising such a nitride-based ceramics sintered body impregnated with a thermosetting resin composition, is considered capable of further improving the thermal conductivity and the tensile shear adhesive strength, because it is easily adhered to a adherend such as a metal plate or a metal circuit board when it is, for example, heat-pressed to the adherend. On the other hand, when the average major diameter of the primary particles of the nitride-based ceramics is 60 μm or less, a decrease in mechanical strength of the nitride-based ceramics resin composite body is suppressed, and the effect that the decrease in the adhesive strength is suppressed is expected. The average major diameter of the ceramics primary particles can be determined by a measurement using an electron microscope.

The average major diameter of the primary particles of the nitride-based ceramics is measured by the following method. As a pretreatment for observation, the nitride-based ceramics powder is embedded in a resin, processed with a CP (cross section polisher) method, fixed on a sample stage, and coated with osmium. Thereafter, an SEM image was taken with a scanning electron microscope (in Example, "JSM-6010LA" (manufactured by JEOL Ltd.)), and the obtained cross-sectional particle image was analyzed with an image analysis software (in the Example, "A image kun" (distributed by Asahi Kasei Engineering Corporation)), and the primary particles can be observed under the conditions that the magnification of the image is 100 times and the number of pixels for image analysis is 15.1 million pixels. The major diameter of arbitrarily observed 100 primary particles are determined, and the average value can be used as the average major diameter. The major diameter of each primary particle refers to the diameter of the smallest circle that can surround the primary particle.

(Average Aspect Ratio of Boron Nitride Primary Particles)

When the porous nitride-based ceramics sintered body is particularly a sintered body containing primary particles of boron nitride, the average value of the aspect ratio of the primary particles of boron nitride (referred to as an average aspect ratio) is preferably in the range of 5.0 to 30. The average aspect ratio of the boron nitride primary particles can be calculated based on the measured values of the primary particles using an electron microscope. When the average aspect ratio of the primary particles of boron nitride is less than 5.0, the modulus of elasticity of the porous nitride-based ceramics sintered body increases, and for example, the properties of the thermal conductive insulating adhesive sheet may deteriorate. Conversely, if the average aspect ratio of the primary particles of boron nitride is greater than 30, the strength of the nitride-based ceramics resin composite body decreases, and the adhesive strength between the thermal conductive insulating adhesive sheet and the adherend may decrease. The average aspect ratio is an average value of the aspect ratios obtained by measuring the major diameters and the minor diameters of 100 particles at the time of observing with an electron microscope and by dividing the major diameter length by the minor diameter length. The minor diameter of each primary particle refers to the diameter of the largest circle that can be surrounded by the primary particle.

(Thermosetting Resin Composition)

Regarding the nitride-based ceramics resin composite body according to one embodiment of the present invention, in the porous nitride-based ceramics sintered body, a thermosetting resin composition is impregnated in an incompletely cured state, and the thermosetting resin composition comprises an epoxy resin in a ratio of 0.2 chemical equivalents or more and 1.5 chemical equivalents or less in total with respect to 1.0 chemical equivalent of a bismaleimide triazine resin, the epoxy resin being one or a combination of two or more selected from bifunctional naphthalene type epoxy resin, alicyclic epoxy resin, dicyclopentadiene type epoxy resin, and hydrogenated bisphenol A type epoxy resin (sometimes referred to as "epoxy resin" in a collective sense). Further, a water absorption of the thermosetting resin composition in a completely cured state measured in accordance with method A in JIS K7209 (2000) is 1% by mass or less. In addition, in the present invention, the chemical equivalent refers to a molar equivalent.

The bismaleimide triazine resin is preferably a resin having both a triazine ring and an imide ring structure, for example, a prepolymer obtained by reacting 5 to 20 parts by mass of methylene bis-p-phenylenedimaleimide with 80 to 95 parts by mass of bisphenol A dicyanate.

Further, the bifunctional naphthalene type epoxy resin is preferably a bifunctional epoxy resin having a naphthalene skeleton, and for example, 1,6-naphthalenediol diglycidyl ether. Further, the alicyclic epoxy resin is perferably an epoxy resin having an alicyclic skeleton, and for example, 3',4'-epoxycyclohexylmethyl 3,4-epoxycyclohexanecarboxylate. Furthermore, the dicyclopentadiene type epoxy resin is preferably a polyfunctional epoxy resin having a dicyclopentadiene skeleton, and is preferably an epoxy resin having a chemical structure represented by (Chemical Formula 1) and/or (Chemical Formula 2). In addition, in (Chemical Formula 1), the value of n is not particularly limited, but can be 0 or an integer of 1 or more, and is usually 1 or more and 10 or less, and preferably 2 or more and 5 or less.

[Chemical Formula 1]

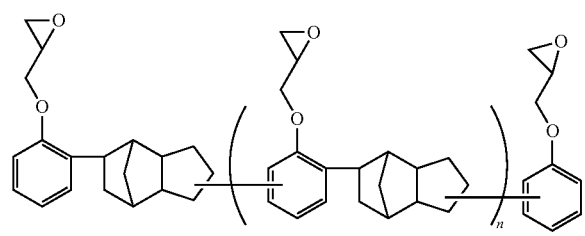

[Chemical Formula 2]

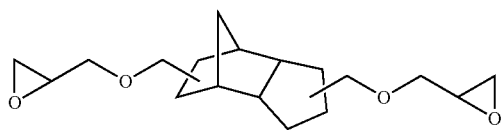

As the above-described hydrogenated bisphenol A type epoxy resin, an epoxy resin having a chemical structure shown in (Chemical Formula 3) is preferred.

[Chemical Formula 3]

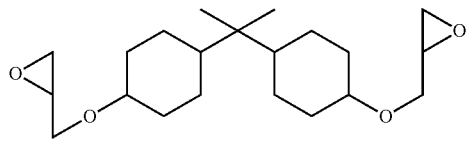

In the thermosetting resin composition according to the present invention, within a range not to impair the solution of the problem of the present invention, a silane coupling agent for improving the adhesion between the nitride-based ceramics sintered body and the thermosetting resin composition can be contained, and an antifoaming agent, a surface conditioner, and a wetting dispersant, for improving the wettability and the leveling property and for promoting the decrease in the viscosity to reduce the generation of defects during impregnation and curing, can be contained.

(Equivalent Ratio of Thermosetting Resin Composition)

In one embodiment of the thermosetting resin composition according to the present invention, with respect to 1.0 chemical equivalent of a bismaleimide triazine resin, an epoxy resin in total is comprised in a ratio of 0.2 chemical equivalents or more and 1.5 chemical equivalents or less, and preferably comprised in a ratio of 0.3 chemical equivalents or more and 1.0 chemical equivalents or less, and more preferably comprised in a ratio of 0.4 chemical equivalents or more and 0.6 chemical equivalents or less. When the ratio of the chemical equivalent of the epoxy resin is less than 0.2, the water absorption of the thermosetting resin composition does not become sufficiently low to achieve the object of the present invention. On the other hand, when the total amount of the epoxy resin exceeds 1.5 chemical equivalents, the curing start temperature of the thermosetting resin composition decreases, and when the thermosetting resin composition is impregnated into the porous nitride-based ceramics sintered body, the curing of the thermosetting resin composition proceeds excessively (that is, the fluidity required for the thermosetting resin composition during impregnation is reduced), so that sufficient impregnation may not be possible.

(Volume Ratio of Thermosetting Resin Composition)

In one embodiment, with respect to the nitride-based ceramics resin composite body, a volume ratio of the thermosetting resin composition is 30% by volume or more and 65% by volume or less, preferably 35% by volume or more and 65% by volume or less, and more preferably 40% by volume or more and 60% by volume or less. If the ratio is less than 30% by volume, when adhering an adherend such as a metal plate or a metal circuit to the thermal conductive insulating adhesive sheet by heating and pressing, it becomes difficult for the thermosetting resin composition to penetrate into the irregularities of the adherend surface, so that tensile shear adhesive strength and thermal conductivity may be decreased. Besides, when the volume ratio is more than 65% by volume, it means that the proportion of the thermosetting resin composition which has a lower thermal conductivity is large, and the thermal conductivity of the entire nitride-based ceramics resin composite body is decreased. In addition, the volume ratio of the thermosetting resin composition in the nitride-based ceramics resin composite body can be reversely calculated from the equation (1) with the following measurement of the bulk density and porosity of the nitride-based ceramics sintered body. Nitride-based ceramics sintered body bulk density (D)=mass of nitride-based ceramics sintered body/volume based on outer dimensions of nitride-based ceramics sintered body (including internal pores)

Porosity of nitride-based ceramics sintered body=(1−(D/true density of nitride-based ceramics))×100=volume ratio of thermosetting resin    Equation (1)

(Incompletely Cured State of Thermosetting Resin Composition)

In the nitride-based ceramics resin composite body according to the present invention, the thermosetting resin composition containing the bismaleimide triazine resin and the epoxy resin needs to be impregnated in the nitride-based ceramics sintered body in an incompletely cured state. Here, the incompletely cured state means that the thermosetting resin composition is in a state of capable of undergoing a further curing reaction. By this curing reaction, when a metal plate or the like is pressed and heated on the surface of a practical product obtained by forming a nitride-based ceramics resin composite body, for example, a thermal conductive insulating adhesive sheet which is one embodiment of the present invention, the two can be adhered with sufficient adhesive strength. In the present invention, although the degree of the incompletely cured state is not strictly defined, for example, the curing rate of the thermosetting resin composition is preferably 5% or more and 80% or less, more preferably 10% or more and 70% or less, even more preferably 30% or more and 65% or less, and even more preferably 40% or more and 60% or less. If the curing rate is less than 5%, the thermosetting resin composition component cannot be retained in the porous nitride-based ceramics sintered body and exudes, and a resin layer having a low thermal conductivity is formed on the surface of the sintered body, so that the thermal conductivity decreases. Further, for example, when the nitride-based ceramics resin composite body is cut into a sheet, the thermosetting resin in the incompletely cured state is melted, and the sheet thickness varies. Further, the nitride-based ceramics resin composite body sometimes cannot withstand the impact at the time of cutting, and cracks may occur, which may lower the dielectric breakdown voltage of the circuit board. Further, when the curing rate exceeds 80%, only a small amount of the reaction component is left in the resin. Accordingly, for example, when the nitride-based ceramics resin composite body according to the present invention is bonded to a metal plate to manufacture a metal circuit board, the adhesive strength between the nitride-based ceramics resin composite body and the metal plate is reduced.

The curing rate of the thermosetting resin composition can be measured using a commercially available differential scanning calorimeter. That is, an amount of heat Q, which is the heat generated when a thermosetting resin composition in a state before curing starts is heated using a differential scanning calorimeter until it is completely cured, and an amount of heat R, which is the heat generated when a resin composition in an incomplete cured state is heated using a differential scanning calorimeter until it is completely cured, are measured, and the curing rate can be calculated by the following equation (2). In addition, whether or not the resin has been completely cured can be confirmed by the end of heat generation in the obtained heat generation curve.

Curing rate (%)=(Q−R)/Q×100    Formula (2)

(Curing Start Temperature of Thermosetting Resin Composition)

In order to sufficiently impregnate the nitride-based ceramics resin composite body, the curing start temperature of the thermosetting resin composition to be impregnated into the nitride-based ceramics resin composite body according to the present invention is preferably 150° C. or more and 300° C. or less, more preferably 170° C. or more and 280° C. or less, and even more 180° C. or more and 250° C. or less. The curing start temperature can be determined, for example, by using a differential scanning calorimeter and measuring the heat generation curve of the thermosetting resin composition in the process of curing it while increasing the temperature at 10° C./min. In the heat generation curve, the curing start temperature is the temperature determined from the intersection of the extrapolation line drawn from the baseline and the tangential line at the point indicating the half calorific value between the calorific values of the baseline and the peak point.

If the curing start temperature is lower than 150° C., when the thermosetting resin composition is impregnated with heating in the porous nitride-based ceramics sintered body, the curing reaction of the thermosetting resin composition proceeds excessively, and the viscosity increases, and the impregnation becomes insufficient, and voids are formed inside, so that the dielectric breakdown voltage may decrease. There is no particular upper limit on the curing start temperature, but considering the workability and the heat resistance of equipment components when adhering adherends such as metal plates and metal circuits to the thermal conductive insulating adhesive sheet by heating and pressing, a temperature of 300° C. or less is realistic. In addition, the curing start temperature can be controlled by adding a curing accelerator or the like.

(Melting Temperature and Evaluation Method of Thermosetting Resin Composition)

The melting temperature of the thermosetting resin composition impregnated in the nitride-based ceramics resin composite body according to the present invention is preferably 70° C. or higher. When the melting temperature is lower than 70° C., for example, the heat at the time of cutting a block-shaped nitride-based ceramics resin composite body into a plate-shaped thermal conductive insulating adhesive sheet may melt the thermosetting resin, so that variations in the thickness may occur. Although the upper limit of the melting temperature is not particularly defined, when an adherend such as a metal plate or a metal circuit is adhered to the thermal conductive insulating adhesive sheet by heating and pressing, it is necessary to suppress the increase in viscosity due to the progress of the curing reaction of the thermosetting resin composition. Considering this, the melting temperature is practically 180° C. or less, and is represented by the temperature of an endothermic peak when the thermosetting resin composition is heated with a differential scanning calorimetry.

(Glass Transition Temperature of Thermosetting Resin Composition)

The glass transition temperature of the thermosetting resin composition impregnated in the nitride-based ceramics resin composite body according to the present invention is preferably 180° C. or more, more preferably 190° C. or more, and even more preferably 200° C. or more. Here, the glass transition temperature is a value obtained by measuring a completely cured thermosetting resin composition with a dynamic viscoelasticity method (DMA method). When a metal circuit board, a power module structure, and an LED light emitter, which are the embodiments of the present invention, are used, the internal temperature becomes high due to the heat generated from the circuit, and when the internal temperature during use exceeds the glass transition temperature of the thermosetting resin composition, there is a risk that the entire nitride-based ceramics resin composite body may be softened and the metal circuit board or the like may be deformed. For this reason, the glass transition temperature of the thermosetting resin composition is preferably higher, but is preferably 180° C. or more from a practical viewpoint.

(Water Absorption of Thermosetting Resin Composition)

In one embodiment of the thermosetting resin composition contained in the nitride-based ceramics resin composite body according to the present invention, the water absorption in a completely cured state measured according to the method A of JIS K7209 (2000) (hereinafter simply referred to as water absorption) is 1% by mass or less, preferably 0.9% by mass or less, more preferably 0.8% by mass or less, with respect to the mass of the thermosetting resin composition. If the water absorption is more than 1% by mass, for example, after forming a sheet-shaped thermal conductive insulating adhesive sheet from a nitride-based ceramics resin composite body, and sandwiching it between metal substrates and heating thereby manufacturing a circuit board, during a reflow process for mounting a semiconductor chip on the circuit board, there is a possibility that the moisture contained in the nitride-based ceramics resin composite body explosively evaporates, and separation occurs from the metal substrate. Since the water absorption is preferably low, the lower limit is not particularly limited, but is usually 0.1% by mass or more, typically 0.5% by mass or more.

(Impregnation of Thermosetting Resin Composition into Nitride-Based Ceramics Sintered Body)

The nitride-based ceramics composite according the present invention can be obtained by impregnating a porous nitride-based ceramics sintered body with a thermosetting resin composition from the outside. The state of the atmospheric pressure when the thermosetting resin composition is impregnated may be either reduced pressure or increased pressure. The pressure during the reduced pressure impregnation is preferably 1,000 Pa or less, more preferably 100 Pa or less. Further, in the case of increased pressure impregnation, the pressure is preferably 1 MPa or more and 300 MPa or less. If the pressure is higher than atmospheric pressure but lower than 1 MPa, the thermosetting resin composition may not be sufficiently impregnated into the nitride-based ceramics sintered body, and if it exceeds 300 MPa, the equipment for impregnation becomes large-scale, which is disadvantageous in cost. At the time of impregnation, in order to facilitate the penetration of the thermosetting resin composition into the interior of the nitride-based ceramics sintered body, at the time of impregnation, the composition can be heated to 100 to 180° C. to reduce the viscosity of the thermosetting resin composition. For example, the viscosity of the thermosetting resin composition at 150° C. under the condition of a shear rate of 10 (1/s) is preferably 20 mPa·s or less, more preferably 10 mPa·s or less, and even more preferably 5 mPa·s or less.

(Surface Treatment of Pores in Nitride-Based Ceramics Sintered Body)

The pore surface of the porous nitride-based ceramics sintered body may be subjected to a surface treatment for improving the adhesion between the nitride-based ceramics sintered body and the thermosetting resin composition. As a surface treatment method, before impregnating the thermosetting resin composition, a method of impregnating the pores of the nitride-based ceramics sintered body with a silane coupling agent solution, and then removing the solvent by drying or the like, can be mentioned. The impregnation with the silane coupling agent solution can be performed by vacuum impregnation, pressure impregnation at 1 MPa or more and 300 MPa or less, or impregnation of a combination thereof. In addition, publicly known solvents such as water, alcohol, and toluene can be used alone or in combination. As a functional group of the silane coupling agent, one having reactivity with the functional group of the thermosetting resin can be appropriately selected, and examples thereof include an epoxy group, a cyanate group, and an amino group.

<Thermal Conductive Insulating Adhesive Sheet>

According to one embodiment of the present invention, the nitride-based ceramics resin composite body according to the present invention is formed into a sheet shape, and the sheet is closely placed between, for example, a heat generating electric circuit board and a cooler. The sheet plays the role of conducting heat while maintaining electrical insulation and is called a thermal conductive insulating adhesive sheet.

(Surface Treatment to Thermal Conductive Insulating Adhesive Sheet)

The surface of the thermal conductive insulating adhesive sheet can be subjected to a surface treatment for improving the adhesion between the insulating layer (the thermal conductive insulating adhesive sheet) and a metal plate or a metal circuit. A surface treatment method can be performed by, before adhering a metal plate or a metal circuit to the insulating layer (the thermal conductive insulating adhesive sheet), applying a silane coupling agent solution to the surface of the thermal conductive insulating adhesive sheet, and then drying the solvent and the like. In addition, publicly known solvents such as water, alcohol, and toluene can be used alone or in combination. As a functional group of the silane coupling agent, one having reactivity with the functional group of the thermosetting resin can be appropriately selected, and examples thereof include an epoxy group, a cyanate group, and an amino group.

(Thickness of Thermal Conductive Insulating Adhesive Sheet)

The thickness of the thermal conductive insulating adhesive sheet according to the present invention is not particularly limited, and can be changed according to required characteristics. For example, when insulation at a high voltage is not so important and thermal resistance is important, a relatively thin sheet of 0.1 to 0.25 mm can be used. On the other hand, when insulation at a high voltage or partial discharge characteristics are important, a relatively thick sheet of 0.35 mm or more can be used.

<Metal Circuit Board>

A single-layer or multi-layer metal circuit board provided with the thermal conductive insulating adhesive sheet according to the present invention as an electrical insulating layer is also one embodiment of the present invention. There are various other names for the metal circuit board here, but it is an integrated board comprising a metal board as a base, and generally an electric circuit equipped with a high heat-generating device such as a power semiconductor mounted via an electric insulating layer on the metal plate.

<Power Module Structure, LED Light Emitter>

A power module structure and an LED light emitter using the metal circuit board according to the present invention are also one embodiment of the present invention. The power module structure is used as an inverter module for railway vehicles or motor vehicles. Examples of the LED light emitter include a lighting device, a vehicle light, a backlight for a liquid crystal display device, a traffic light, and the like.

EXAMPLES

Hereinafter, the present invention will be described more specifically with reference to Examples and Comparative Examples.

(Porous Nitride-Based Ceramics Sintered Body)

As preparations for obtaining the nitride-based ceramics resin composite bodies of Examples and Comparative Examples, porous nitride-based ceramics sintered bodies denoted by C1 to C6 were prepared.

For example, in the case of preparing a nitride-based ceramics sintered body of C1, as shown in Table 1, ethanol as a medium was added to 40.0% by mass of amorphous boron nitride powder (SP, manufactured by Denka Company Limited.) and 60% by mass of hexagonal boron nitride powder (MGP, manufactured by Denka Company Limited.) and they were mixed in a ball mill using silicon nitride balls in a wet manner for 2 hours, followed by drying and crushing to obtain a mixed powder of nitride-based ceramics. The mixed powder was filled in a mold and press-molded at a pressure of 5 MPa. The obtained formed body was treated to solidify it by applying a pressure of 100 MPa with a CIP (cold isostatic pressing method) device (device name: ADW800, manufactured by Kobe Steel Ltd.), and then in a batch type high frequency furnace (device name: FTH-300-1H, manufactured by Fujidempa KogyoCo., Ltd.), nitrogen was flowed into the furnace at a flow rate of 10 (liter/min) under a standard condition to establish a nitrogen atmosphere, and the formed body was retained and sintered at 2000° C. for 10 hours to obtain the nitride-based ceramics sintered body of C1.

Also, in the case of preparing nitride-based ceramics sintered bodies named C2 to C6, the nitride-based ceramics and sintering aids shown in Table 1 were mixed using the same device as C1. The obtained mixed powders were respectively processed under the conditions shown in Table 1 with the above-mentioned CIP device, and were further sintered under the conditions shown in Table 1, to obtain the nitride-based ceramics sintered bodies of C2 to C6.

In order to confirm the internal structure of the obtained nitride-based ceramics sintered bodies of C1 to C6, each above-described sintered body was embedded in an epoxy resin, and then subjected to a cross section processing with a CP (cross-section polisher) method, and further to a osmium coating on the cross section. Thereafter, primary particles present on an arbitrary cross section of the nitride-based ceramics sintered body were observed at a magnification of 1500 times using a scanning electron microscope. As a result, it was confirmed that the nitride-based ceramics sintered bodies named C1 to C6 had a porous structure in which the primary particles are connected three-dimensionally and continuously by the sintering while the pores are continuous.

(Thermosetting Resin Composition)

As a preparation for obtaining the nitride-based ceramics resin composite bodies of Examples and Comparative examples, as shown in Table 2, thermosetting resin compositions denoted by names R1 to R20 were prepared.

For example, as shown in Table 2, the thermosetting resin composition indicated by the name of R1 was mixed so as to have a ratio of 1.0 chemical equivalent of a bismaleimide triazine resin (BT2160, Mitsubishi Gas Chemical Company, Inc.) and 0.5 chemical equivalent of a bifunctional naphthalene type epoxy resin (HP4032D, DIC Corporation). In addition, the mixing was carried out in a manner using a stainless steel container and stirring the resin with a vinyl chloride rod to mix the resin. However, since the epoxy resin HP4032D is in a solidified state at room temperature, it was kept at about 80° C. in advance in order to use in a liquefied state. The bifunctional naphthalene type epoxy resin used for R1 was 1,6-naphthalene diol diglycidyl ether.

TABLE 1

| | Chemical name | Average major diameter (μm) | | C1 | C2 | C3 | C4 | C5 | C6 |
|---|---|---|---|---|---|---|---|---|---|
| Nitride-based ceramics | Amorphous boron nitride | 6.0 | (mass %) | 40.0 | 34.0 | 34.0 | 33.7 | 33.7 | — |
| | Hexagonal boron nitride | 18.0 | | 60.0 | 64.2 | 64.2 | — | — | — |
| | Silicon nitride | 7.5 | | — | — | — | 63.5 | — | 46 |
| | Aluminum nitride | 7.5 | | — | — | — | — | 63.5 | 60 |
| Sintering aid | Calcium carbonate | — | (mass %) | — | 0.6 | 0.6 | 0.6 | 0.6 | 0.6 |
| | Boric acid | — | | — | 1.2 | 1.2 | — | — | — |
| | Aluminum oxide | — | | — | — | — | 1.2 | — | — |
| | Tricalcium phosphate | — | | — | — | — | — | 1.2 | 1.2 |
| | Yttrium oxide | — | | — | — | — | 1.0 | 1.0 | 1.0 |
| Sintering conditions | Mold pressure | (MPa) | | 5 | — | — | — | — | — |
| | CIP device pressure (MPa) | (MPa) | | 100 | 20 | 100 | 75 | 75 | 75 |
| | Sintering temperature | (° C.) | | 2000 | 2000 | 2000 | 1850 | 1850 | 1850 |
| | Retention time | (hour) | | 10 | 10 | 10 | 10 | 10 | 10 |
| | Nitrogen flow rate | Liter/min | | 10 | 10 | 10 | 10 | 10 | 10 |

TABLE 2

| Name of thermosetting resin composition | Type and name of thermosetting resin added to bismaleimide triazine resin | Chemical equivalent of epoxy resin in thermosetting resin composition with respect to 1.0 chemical equivalent of bismaleimide triazine resin | Melting temperature of thermosetting resin composition (° C.) | Curing start temperature of thermosetting resin composition (° C.) | Glass transition temperature of thermosetting resin composition (° C.) | Shear viscosity at 150° C. of thermosetting resin composition (mPa · s) | Water adsorption (%) after curing of thermosetting resin composition |
|---|---|---|---|---|---|---|---|
| R1 | Bifunctional naphthalene type epoxy resin (HP4032D: DIC Corporation) | 0.5 | 80 | 205 | 264.22 | 15 | 0.78 |
| R2 | Bifunctional naphthalene type epoxy resin (HP4032D: DIC Corporation) | 0.2 | 80 | 212 | 292.06 | 18 | 0.92 |
| R3 | Bifunctional naphthalene type epoxy resin (HP4032D: DIC Corporation) | 1.5 | 80 | 200 | 231.85 | 14 | 0.75 |
| R4 | Alicyclic epoxy resin (CEL2021P: Daicel Corporation) | 0.5 | 80 | 200 | 232.81 | 18 | 0.68 |
| R5 | Dicyclopentediene type epoxy resin (HP7200L: DIC Corporation) | 0.5 | 80 | 201 | 249.54 | 15 | 0.61 |
| R6 | Dicyclopentadiene type epoxy resin (EP4088L: ADEKA CORPORATION) | 0.5 | 80 | 190 | 216.04 | 12 | 0.77 |
| R7 | Hydrogenated bisphenol A type epoxy resin (YX8000 Mitsubishi Chemical Corporation) | 0.5 | 80 | 195 | 222.67 | 15 | 0.73 |
| R8 | None | 0.5 | 80 | 215 | 310.00 | 20 | 1.30 |
| R9 | Epoxy group-containing isocyanuric acid derivative (MA-DGIC: SHIKOKU CHEMICALS CORPORATION) | 0.5 | 80 | 210 | 281.50 | 20 | 1.16 |
| R10 | Epoxy resin with isocyanurate skeleton (TEPIC-VL: Nissan Chemical Corporation) | 0.5 | 80 | 208 | 279.78 | 20 | 1.11 |
| R11 | Trifunctional epoxy resin (EP3950S: ADEKA CORPORATION) | 0.5 | 80 | 203 | 298.74 | 18 | 1.09 |
| R12 | Rubber-modified epoxy resin (TSR960: DIC Corporation) | 0.5 | 80 | 200 | 234.92 | 19 | 0.88 |
| R13 | Phenol novolak type epoxy resin (N775: DIC Corporation) | 0.5 | 80 | 205 | 285.76 | 20 | 0.87 |
| R14 | Bisphenol A type epoxy resin (EXA850CRP: DIC Corporation) | 0.5 | 80 | 198 | 252.03 | 17 | 0.82 |
| R15 | Phenol novolak type epoxy resin (JER152: Mitsubishi Chemical Corporation) | 0.5 | 80 | 195 | 256.68 | 16 | 0.81 |

TABLE 2-continued

| Name of thermosetting resin composition | Type and name of thermosetting resin added to bismaleimide triazine resin | Chemical equivalent of epoxy resin in thermosetting resin composition with respect to 1.0 chemical equivalent of bismaleimide triazine resin | Melting temperature of thermosetting resin composition (° C.) | Curing start temperature of thermosetting resin composition (° C.) | Glass transition temperature of thermosetting resin composition (° C.) | Shear viscosity at 150° C. of thermosetting resin composition (mPa · s) | Water adsorption (%) after curing of thermosetting resin composition |
|---|---|---|---|---|---|---|---|
| R16 | Bisphenol F type epoxy resin (JER807: Mitsubishi Chemical Corporation) | 0.5 | 80 | 196 | 233.93 | 20 | 0.73 |
| R17 | Naphthylene ether type epoxy compound (HP6000: DIC Corporation) | 0.5 | 80 | 200 | 276.82 | 15 | 0.68 |
| R18 | Propylene glycol-modified epoxy resin (EP4000L: ADEKA CORPORATION) | 0.5 | 80 | 210 | 173.94 | 18 | 0.63 |
| R19 | Epoxy containing polypropylene glycol skeleton (EXA4850-1000: DIC Corporation) | 0.5 | 80 | 205 | 170.27 | 19 | 0.60 |
| R20 | Monofunctional epoxy resin (ED509S: ADEKA CORPORATION) | 0.5 | 80 | 200 | 185.26 | 20 | 0.53 |

The thermosetting resin compositions indicated by the names of R2 to R7 and R9 to R20 were also mixed and prepared in the same manner as R1 with the epoxy resins of the types shown in Table 2 in the chemical equivalents shown in Table 2, with respect to 1.0 chemical equivalent of a bismaleimide triazine resin (BT2160, Mitsubishi Gas Chemical Company, Inc.), respectively. In addition, the alicyclic epoxy resin used in R4 was 3',4'-epoxycyclohexylmethyl 3,4-epoxycyclohexanecarboxylate, and the dicyclopentadiene type epoxy resin used in R5 was the epoxy resin shown in the above-described (Chemical Formula 1) (n=3 to 4), and the dicyclopentadiene type epoxy resin used in R6 was the epoxy resin shown in the above-described (Chemical Formula 2), and the hydrogenated bisphenol type epoxy resin used in R7 was an epoxy resin shown in the above-described (Chemical Formula 3). The thermosetting resin composition indicated by the name of R6 is a simple substance of the above-described bismaleimide triazine resin (BT2160, Mitsubishi Gas Chemical Company, Inc.).

(Water Absorption of Thermosetting Resin Composition)

Wth respect to the thermosetting resin compositions R1 to R20, the water absorption after being completely cured was measured in accordance with the method A of JIS K7209 (2000), and the results are shown in Table 2.

(Method of Measuring Water Absorption)

The specific procedure for measuring the water absorption was in accordance with the following procedure. That is, a test piece consisting only of each thermosetting resin composition after being completely cured was preliminarily dried with a dryer such as a shelf dryer at 50.0±2.0° C. for 24±1 hour. Then, within 1 minute after removing the test piece from the dryer, the weight of the test piece after initial drying (referred to as X) was measured to the unit of 0.1 mg with a precision balance. Thereafter, the test piece was immersed in distilled water at 23.0±1.0° C. for 24 hours to absorb water, and then was taken out, and after wiping off moisture on the surface of the test piece, the entire mass (referred to as Y) was measured with a precision balance. Using these values, the value of the water absorption of the thermosetting resin composition was determined by the following equation (3). In addition, Y is also a value measured to the unit of 0.1 mg.

$$\text{Water absorption (\% by mass)} = (Y-X)/X \times 100 \qquad \text{Equation (3)}$$

(Glass Transition Temperature of Thermosetting Resin Composition)

Wth respect to the thermosetting resin compositions R1 to R20, the glass transition temperature after being completely cured was measured by a dynamic viscoelasticity method. Specifically, a test piece consisting of only each thermosetting resin composition after being completely cured was measured using a dynamic viscoelasticity measurement device (device name: RSA-G2, manufactured by TA Instruments). The conditions were set as below. Sample width before measurement/thickness length: 8 mm/0.5 mm/10 mm (length is the distance between sample chucks); frequency: 1 Hz; applied strain: 0.01 to 0.8%; measurement start/measurement end temperature: 50° C./330° C.; temperature elevation rate of 5° C./min. The storage modulus of elasticity and the loss modulus of elasticity were determined, and the temperature at which the ratio value (generally referred to as tan δ) peaked was defined as the glass transition temperature of the thermosetting resin. The results are shown in Table 2.

(Manufacturing of Nitride-Based Ceramics Resin Composite Body)

The nitride-based ceramics resin composite bodies shown in Examples 1 to 18 and Comparative Examples 1 to 13 were manufactured by combining the nitride-based ceramics sintered bodies and the thermosetting resin compositions shown in Tables 3 and 4. In this case, the method of impregnation of the thermosetting resin composition into the nitride-based ceramics sintered body, the impregnation conditions, and the like are all the same. That is, any one of the nitride-based ceramics sintered bodies of C1 to C6 was respectively degassed for 10 minutes at a temperature of 145° C. and under a reduced pressure of 15 Pa using a vacuum-heated impregnating device (device name: G-555AT-R, manufactured by KYOSIN ENGINIEERING CORPORATION), and was subsequently immersed in any one of the thermosetting resin compositions of R1 to R20 while maintaining the same condition. After this was once taken out, it was further transferred to a pressurized heating impregnation device (device name: HP-4030AA-H45, manufactured by KYOSIN ENGINIEERING CORPORATION) and kept at a temperature of 145° C. under an increased pressure of 3.5 MPa for 120 minutes. Thereafter, the thermosetting resin composition was incompletely cured by heating at 160° C. under atmospheric pressure to obtain a final nitride-based ceramics resin composite body.

(Volume Ratio of Thermosetting Resin Composition Impregnated in Nitride-Based Ceramics Resin Composite Body)

The volume ratios of the thermosetting resin compositions impregnated in the nitride-based ceramics resin composite bodies of Examples 1 to 18 and Comparative Examples 1 to 13 were calculated from the above-described equation (1). The results are shown in Tables 3 and 4.

(Curing Rate of Impregnated Thermosetting Resin Composition)

As a method for determining the curing rate of the thermosetting resin compositions impregnated in the nitride-based ceramics resin composite bodies of Examples 1 to 18 and Comparative Examples 1 to 13, a differential scanning calorimeter (device name: DSC6200, manufactured by Seiko Instruments Inc.) was used for evaluation.

Specifically, first, the calorific value (a) generated when the uncured thermosetting resin composition was completely cured by raising the temperature was determined. Then, the temperature of the nitride-based ceramics resin composite bodies after the impregnation were raised in the same manner, and the calorific value (b) generated when the thermosetting resin composition impregnated in the ceramics resin composite body was completely cured was determined. At this time, the measurement of the uncured thermosetting resin composition and the nitride-based ceramics resin composite body by a differential scanning calorimeter were performed with the same mass. Assuming that the thermosetting resin composition contained in the nitride-based ceramics resin composite body is c (% by weight), the cure rate of the thermosetting resin composition impregnated in the nitride-based ceramics resin composite body can be calculated by the following formula.

Curing rate (%)=(1−$b$×100÷$c$÷$a$)×100

(Manufacturing of Thermal Conductive Insulating Adhesive Sheet)

The nitride-based ceramics resin composite bodies of Examples 1 to 18 and Comparative Examples 1 to 13, which were block-shaped, were respectively cut out to obtain a 320 μm-thick sheet using a multi-wire saw (device name: MWS-32N, manufactured by Takatori Corporation.) so that the thermal conductive insulating adhesive sheets of Examples 1 to 18 and Comparative Examples 1 to 13 were manufactured. Examples and Comparative Examples of the nitride-based ceramics resin composite body and the corresponding thermal conductive insulating adhesive sheet were given the same numbers.

(Suitability Evaluation of Reflow Process of Thermal Conductive Insulating Adhesive Sheet)

Using the obtained thermal conductive insulating adhesive sheets of Examples 1 to 18 and Comparative Examples 1 to 13, the heat resistance reliability at the time of reflow process when using them was evaluated. That is, the thermal conductive insulating adhesive sheets of Examples 1 to 18 and Comparative Examples 1 to 13 were cut out to a size of 2 cm/2 cm in length/width, and both sides of each of the thermal conductive insulating adhesive sheets were press-bonded to a copper plate having the same outer size as the thermal conductive insulating adhesive sheet and a thickness of 1.0 mm under the conditions of a pressure of 100 kgf/cm$^2$, a heating temperature of 180° C. and a heating time of 1 hour using a vacuum heating press machine (device name: MHPC-VF-350-350-1-45, manufactured by Meiki Co., Ltd.), and thereby a laminate for evaluation was prepared. Each of the laminates was set at 320° C. for 1 minute. Thereafter, the appearance of the laminate was visually checked to determine whether separation had occurred between the thermal conductive insulating adhesive sheet and the copper plate. At this time, if the space between the thermal conductive insulating adhesive sheet and the copper plate swelled, it was judged that separation had occurred and was unqualified. The results are shown in Tables 3 and 4.

(Evaluation of Dielectric Breakdown Voltage of Thermal Conductive Insulating Adhesive Sheet)

The dielectric breakdown voltages of the obtained thermal conductive insulating adhesive sheets of Examples 1 to 18 and Comparative Examples 1 to 13 were measured in accordance with JIS C2110 (2016). In the measurement, using the same laminate as each of the laminates used in the evaluation of the reflow process suitability, one side of each laminate was screen-printed with an etching resist in a circular shape having a diameter of 20 mm, and the other side was screen-printed with an etching resist in a solid pattern shape. After curing the etching resist with ultraviolet light, one surface of the metal plate was etched with a cupric chloride solution to form a circular copper circuit having a diameter of 20 mm on one surface of the laminate. Next, the resist was peeled off with an alkaline solution, and then electroless Ni-P plating having a thickness of 2 μm was performed to manufacture a circuit board for evaluation. The circuit board was immersed in an insulating oil, and an AC voltage was applied between the copper foil and an aluminum plate at room temperature, and the dielectric breakdown voltage was measured based on JIS C2110-1 (2016) using a withstand voltage tester (device name: TOS-8700, manufactured by KIKUSU I ELECTRONICS CORPORATION) measure. In addition, the dielectric breakdown voltage of Example 1 was 10.0 kV. Tables 3 and 4 show the dielectric breakdown voltage of other Examples and Comparative Examples. If the dielectric breakdown voltage of the thermal conductive insulating adhesive sheet used in this evaluation was 9.0 kV or more, it was a practically good value.

(Evaluation of Thermal Conductivity of Thermal Conductive Insulating Adhesive Sheet)

Two copper plates having a thickness of 1 mm were adhered to each of the thermal conductive insulating adhesive sheets of Examples 1 to 18 and Comparative Examples 1 to 13. And the opposite side), and the thermal conductivity between both copper plate surfaces (the side opposite to the adhesive surface) including the thermal conductive insulating adhesive sheet was measured. In this case, the thermal conductivity was not only the thermal conductivity of the thermal conductive insulating adhesive sheet but also the thermal conductivity including the interfacial thermal resistance between the copper plates and the adhesive sheet. Specifically, a laser flash method thermal constant measuring device (device name: TC-1200RH, manufactured by ADVANCE RIKO, Inc.) was used in accordance with JIS R1611 (1997). In addition, the thermal conductivity of Example 1 at 25° C. was 100 W/(m·K). Tables 3 and 4 show the thermal conductivity of other Examples and Comparative Examples. The thermal conductivity of the thermal conductive insulating adhesive sheet was also affected by the type of the nitride-based ceramics sintered body used, but the thermal conductivity of the thermal conductive insulating adhesive sheet used in this evaluation would be a value sufficient for practical use if it was at least 30 W/(m·K). The evaluation results of the obtained thermal conductivity are shown in Tables 3 and 4.

(Evaluation of Tensile Shear Adhesive Strength of Thermal Conductive Insulating Adhesive Sheet)

The tensile shear adhesive strength between the obtained thermal conductive insulating adhesive sheets of Examples 1 to 18 and Comparative Examples 1 to 13, and a copper plate was evaluated. That is, each thermal conductive insulating adhesive sheet of Examples 1 to 18 and Comparative Examples 1 to 13 was cut out to a size of 25 mm/12.5 mm in width/length according to JIS K6850 (1999), and both sides of the thermal conductive insulating adhesive sheet were sandwiched by copper plates having a width/length of 25 mm/100 mm and a thickness of 1.0 mm so as to have a uniform width and a adhered portion having a length of 12.5 mm, and under the condition of a heating temperature of 240° C. and a heating time of 5 hours, they were subjected to vacuum heating press bonding to prepare a test piece for evaluating the shear adhesive strength (Refer to FIG. 1 the shape and dimensions (1) of the test piece (adhesive plate) described in JIS K6850 (1999)). An autograph (device name: AG-100 kN, manufactured by Shimadzu Corporation) was used as a measuring device for the tensile shear adhesive strength, and the measurement conditions were a measurement environment temperature of 25° C. and a tensile crosshead speed of 5.0 mm/min. In addition, the tensile shear adhesive strength of Example 1 was 2.0 MPa. Tables 3 and 4 also show the tensile shear adhesive strengths of the other Examples and Comparative Examples. In addition, if the tensile shear adhesive strength of the thermal conductive insulating adhesive sheet used in this evaluation was 1.6 MPa or more, it was judged that the adhesiveness was good and the value was practically good. For test pieces that did not adhere, a value of 0 was entered for convenience.

TABLE 3

| | Example 1 | Example 2 | Example 3 | Example 4 | Example 5 | Example 6 | Example 7 | Example 8 | Example 9 |
|---|---|---|---|---|---|---|---|---|---|
| Name of nitride-based ceramics sintered body | C1 | C1 | C2 | C2 | C3 | C4 | C5 | C6 | C1 |
| Name of thermosetting resin composition | R1 | R1 | R1 | R1 | R1 | R1 | R1 | R1 | R2 |
| Volume ratio occupied by thermosetting resin composition (%) | 45 | 45 | 65 | 65 | 56 | 60 | 60 | 60 | 45 |
| Curing rate of thermosetting resin composition at the time used for thermal conductive insulating adhesive sheet (%) | 55 | 69 | 51 | 68 | 52 | 58 | 46 | 55 | 52 |
| Water absorption after curing of thermosetting resin composition (%) | 0.78 | 0.78 | 0.78 | 0.78 | 0.78 | 0.78 | 0.78 | 0.78 | 0.92 |
| Seperation after reflow process | None | None | None | None | None | None | None | None | None |
| Dielectric breakdown voltage after adhering components to thermal conductive insulating adhesive sheet (kV) | 10.0 | 9.9 | 9.8 | 9.7 | 9.6 | 10.0 | 10.6 | 10.0 | 10.5 |

TABLE 3-continued

| | | | | | | | | | |
|---|---|---|---|---|---|---|---|---|---|
| Thermal conductivity after adhering components to thermal conductive insulating adhesive sheet (W/(m · K)) | 100 | 100 | 35 | 35 | 62 | 48 | 46 | 50 | 95 |
| Tensile shear adhesive strength after adhering components to thermal conductive insulating adhesive sheet (MPa) | 2.0 | 1.9 | 3.6 | 3.6 | 3.0 | 3.3 | 3.3 | 3.0 | 2.2 |

| | Example 10 | Example 11 | Example 12 | Example 13 | Example 14 | Example 15 | Example 16 | Example 17 | Example 18 |
|---|---|---|---|---|---|---|---|---|---|
| Name of nitride-based ceramics sintered body | C1 | C1 | C3 | C1 | C3 | C1 | C3 | C1 | C3 |
| Name of thermosetting resin composition | R3 | R4 | R4 | R5 | R5 | R6 | R6 | R7 | R7 |
| Volume ratio occupied by thermosetting resin composition (%) | 45 | 45 | 55 | 45 | 55 | 45 | 56 | 46 | 66 |
| Curing rate of thermosetting resin composition at the time used for thermal conductive insulating adhesive sheet (%) | 48 | 52 | 57 | 44 | 46 | 55 | 52 | 45 | 48 |
| Water absorption after curing of thermosetting resin composition (%) | 0.75 | 0.68 | 0.68 | 0.61 | 0.61 | 0.77 | 0.77 | 0.73 | 0.73 |
| Seperation after reflow process | None | None | None | None | None | None | None | None | None |
| Dielectric breakdown voltage after adhering components to thermal conductive insulating adhesive sheet (kV) | 11.2 | 11.0 | 10.5 | 9.6 | 9.3 | 10.5 | 9.9 | 9.6 | 10.2 |
| Thermal conductivity after adhering components to thermal conductive insulating adhesive sheet (W/(m · K)) | 98 | 105 | 63 | 110 | 68 | 102 | 60 | 108 | 64 |

TABLE 3-continued

|  |  |  |  |  |  |  |  |  |
|---|---|---|---|---|---|---|---|---|
| Tensile shear adhesive strength after adhering components to thermal conductive insulating adhesive sheet (MPa) | 2.0 | 1.9 | 3.7 | 2.0 | 3.7 | 1.8 | 3.6 | 1.9 | 3.4 |

TABLE 4

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Name of nitride-based ceramics sintered body | C1 | C1 | C1 | C1 | C1 | C1 | C1 |
| Name of thermosetting resin composition | R8 | R9 | R10 | R11 | R12 | R13 | R14 |
| Volume ratio occupied by thermosetting resin composition (%) | 45 | 45 | 45 | 45 | 45 | 45 | 45 |
| Curing rate of thermosetting resin composition at the time used for thermal conductive insulating adhesive sheet (%) | 58 | 54 | 57 | 49 | 52 | 51 | 58 |
| Water adsorption after curing of thermosetting resin composition (%) | 1.30 | 1.16 | 1.11 | 1.09 | 0.88 | 0.87 | 0.82 |
| Seperation after reflow process | Occurred | Occurred | Occurred | Occurred | None | None | None |
| Dielectric breakdown voltage after adhering components to thermal conductive insulating adhesive sheet (kV) | 11.7 | 10.7 | 10.6 | 11.3 | 8.9 | 10.8 | 9.5 |
| Thermal conductivity after adhering components to thermal conductive insulating adhesive sheet (W/(m·K)) | 98 | 102 | 105 | 101 | 99 | 95 | 98 |
| Tensile shear adhesive strength after adhering components to thermal conductive insulating adhesive sheet (MPa) | 2.4 | 0 | 0 | 0 | 2.3 | 1.4 | 1.5 |

TABLE 4-continued

|  | Comparative Example 8 | Comparative Example 9 | Comparative Example 10 | Comparative Example 11 | Comparative Example 12 | Comparative Example 13 |
| --- | --- | --- | --- | --- | --- | --- |
| Name of nitride-based ceramics sintered body | C1 | C1 | C1 | C1 | C1 | C1 |
| Name of thermosetting resin composition | R15 | R16 | R17 | R18 | R19 | R20 |
| Volume ratio occupied by thermosetting resin composition (%) | 45 | 45 | 45 | 45 | 45 | 45 |
| Curing rate of thermosetting resin composition at the time used for thermal conductive insulating adhesive sheet (%) | 59 | 56 | 52 | 49 | 53 | 55 |
| Water adsorption after curing of thermosetting resin composition (%) | 0.81 | 0.73 | 0.68 | 0.63 | 0.60 | 0.53 |
| Seperation after reflow process | None | None | None | None | None | None |
| Dielectric breakdown voltage after adhering components to thermal conductive insulating adhesive sheet (kV) | 7.0 | 7.4 | 10.5 | 6.6 | 6.4 | 7.0 |
| Thermal conductivity after adhering components to thermal conductive insulating adhesive sheet (W/(m · K)) | 85 | 95 | 102 | 99 | 100 | 101 |
| Tensile shear adhesive strength after adhering components to thermal conductive insulating adhesive sheet (MPa) | 1.8 | 2.1 | 0 | 1.6 | 1.2 | 1.9 |

As is apparent from the comparison between Examples 1 to 18 and Comparative Examples 1 to 13, when the thermal conductive insulating adhesive sheet processed from the nitride-based ceramics resin composition according to the present invention was used, the problem of separation during the reflow process did not occur while the properties such as thermal conductivity, dielectric breakdown voltage, and adhesion strength with metal plates were maintained at the same level as conventional ones. That is, it can be seen that the heat resistance reliability has been improved and the characteristics are more excellent in balance.

What is claimed is:

1. A nitride-based ceramics resin composite body in which a thermosetting resin composition is impregnated in an incompletely cured state in a porous nitride-based ceramics sintered body having three-dimensionally continuous pores, the sintered body being formed of primary particles of a nitride-based ceramics that is one or a combination of two or more selected from a group consisting of boron nitride, aluminum nitride, and silicon nitride, wherein
the thermosetting resin composition comprises an epoxy resin in a ratio of 0.2 chemical equivalents or more and 1.5 chemical equivalents or less in total with respect to 1.0 chemical equivalent of a bismaleimide triazine resin, the epoxy resin being one or a combination of two or more selected from a group consisting of bifunctional naphthalene type epoxy resin, alicyclic epoxy resin, dicyclopentadiene type epoxy resin, and hydrogenated bisphenol A type epoxy resin, and a volume ratio of the thermosetting resin composition is 30% by volume or more and 65% by volume or less with respect to the nitride-based ceramics resin composite body, and a water absorption of the thermosetting resin composition in a completely cured state measured in accordance with method A in JIS K7209 (2000) is 1% by mass or less.

2. The nitride-based ceramics resin composite body according to claim 1, wherein the porous nitride-based ceramics sintered body is a sintered body of primary particles of boron nitride.

3. The nitride-based ceramics resin composite body according to claim 1, wherein the thermosetting resin composition is impregnated in an incompletely cured state having a curing rate of 5% to 80%.

4. The nitride-based ceramics resin composite body according to any one of claim 1, wherein a glass transition temperature of the thermosetting resin composition is 180° C. or higher.

5. The nitride-based ceramics resin composite body according to any one of claim 1, wherein the bifunctional naphthalene type epoxy resin is 1,6-naphthalene diol diglycidyl ether;

the alicyclic epoxy resin is 3',4'-epoxycyclohexylmethyl 3,4-epoxycyclohexanecarboxylate;

the dicyclopentadiene type epoxy resin is an epoxy resin having a chemical structure represented by (Chemical Formula 1) and/or (Chemical Formula 2); and the hydrogenated bisphenol A type epoxy resin is an epoxy resin having a chemical structure represented by (Chemical Formula 3),

[Chemical Formula 1]

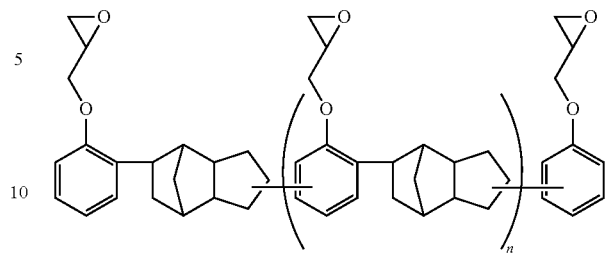

(In the formula, n is 0 or an integer of 1 or more.)

[Chemical Formula 2]

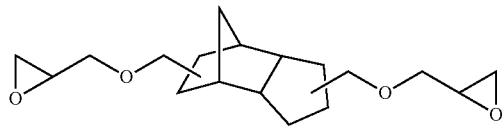

[Chemical Formula 3]

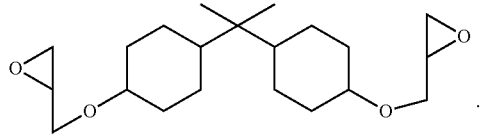

6. A thermal conductive insulating adhesive sheet comprising the nitride-based ceramics resin composite body according to claim 1.

7. A single-layer or multilayer metal circuit board, comprising the thermal conductive insulating adhesive sheet according to claim 6 as an electrical insulating layer.

8. A power module structure comprising the metal circuit board according to claim 7.

9. An LED light emitter comprising the metal circuit board according to claim 7.

* * * * *